(12) United States Patent  
Godin

(10) Patent No.: US 7,015,724 B2  
(45) Date of Patent: Mar. 21, 2006

(54) DEVICE FOR PROCESSING AN OPTICAL SIGNAL

(75) Inventor: Jean Godin, St-Maur-des-Foues (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/792,846

(22) Filed: Mar. 5, 2004

(65) Prior Publication Data

US 2004/0174280 A1    Sep. 9, 2004

(30) Foreign Application Priority Data

Mar. 7, 2003    (FR) .................................. 03 02828

(51) Int. Cl.  
*H03K 19/10* (2006.01)
(52) U.S. Cl. ..................................... 326/134; 326/133
(58) Field of Classification Search ........ 326/131–135; 327/195, 196, 570, 571
See application file for complete search history.

(56) References Cited

U.S. PATENT DOCUMENTS

| 3,234,399 | A | * | 2/1966 | Lo Casale .................. 326/134 |
| 3,253,165 | A |   | 5/1966 | Cornish |
| 3,456,128 | A |   | 7/1969 | Myers |
| 3,889,134 | A |   | 6/1975 | Basham |
| 5,773,996 | A | * | 6/1998 | Takao ........................ 326/135 |
| 5,825,240 | A | * | 10/1998 | Geis et al. .................. 327/570 |
| 6,316,965 | B1 | * | 11/2001 | Jonker et al. ............... 326/134 |
| 6,362,660 | B1 | * | 3/2002 | Deng ......................... 326/134 |

OTHER PUBLICATIONS

K. Murata et al, "An Optoelectronic Clock Recovery Circuit Using a Resonant Tunneling Diode and a Uni-Traveling-Carrier Photodiode", IEICE Transactions on Communications, Institute of Electronics Information and Comm. Eng., Tokyo, Japan, vol. E82-B, No. 8, Aug. 1999, pp. 1228-1235, XP001033213.

T. Akeyoshi et al, "Application of Resonant-Tunneling Diodes to High Speed Digital IC's" Conference on Indium Phosphide and Related Materials, May 16-20, 1999, pp. 405-410, XP002257719.

Sanu Kimikazu et al, "An 80-Gb/s Optoelectronic Delayed Flip-Flop IC Using Resonant Tunneling Diodes and Uni-Traveling Carrier Photodiode", IEEE Journal of Solid State Circuits, vol. 36, No. 2, Feb. 2001, pp. 281-289, XP002257720.

* cited by examiner

*Primary Examiner*—Vibol Tan  
(74) *Attorney, Agent, or Firm*—Sughrue Mion, PLLC

(57) ABSTRACT

To make a decision circuit for RZ format optical signals at a very high data rate, the device (1') comprises an electronic component (2) having a tunnel diode characteristic presenting a peak current ($I_P$) and a valley current ($I_V$). The device (1') comprises a control current source (9) controlled by a control signal ($V_{RESET}$) said current being injected into the component (2) and taking a first value or a second value. In response to an input optical signal (E), generator means (2) generate a current ($I_{RZ}$) into the component (2). The valley current ($I_V$) is of a value greater than the first current value and the peak current ($I_P$) is of a value lying between a second current value ($I_R$) and the sum of said second value plus the value ($I_{RZ}$) of the current generated the generator means (2).

13 Claims, 7 Drawing Sheets

FIG_1
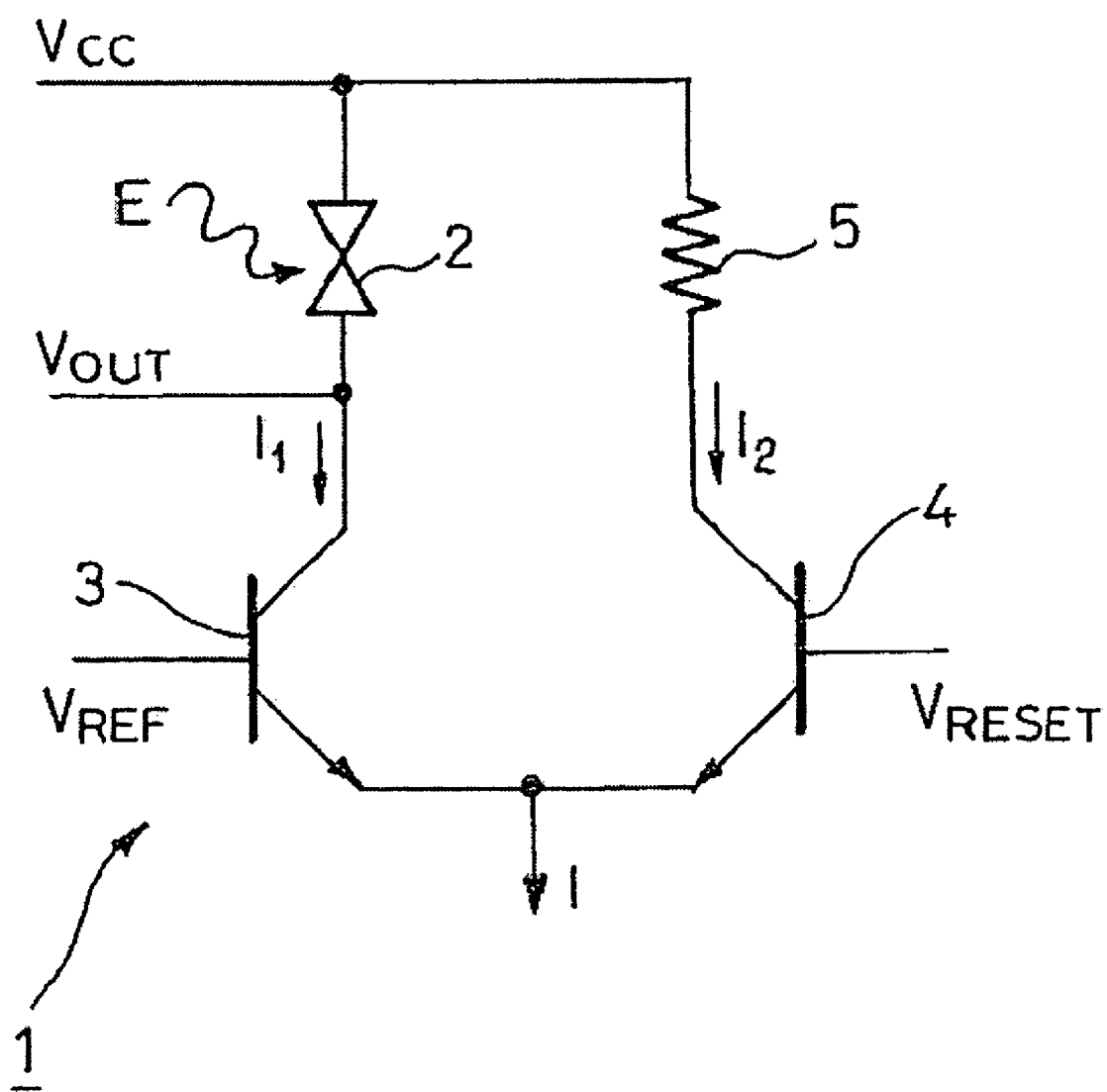

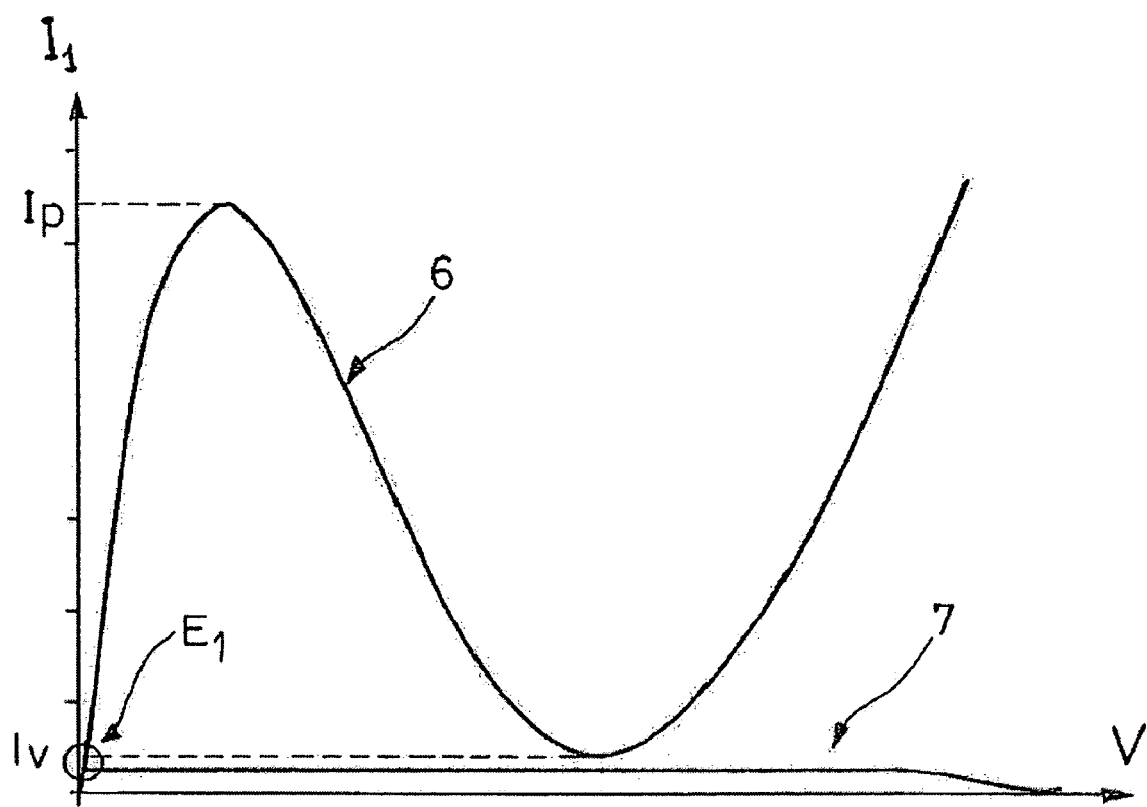

FIG_3
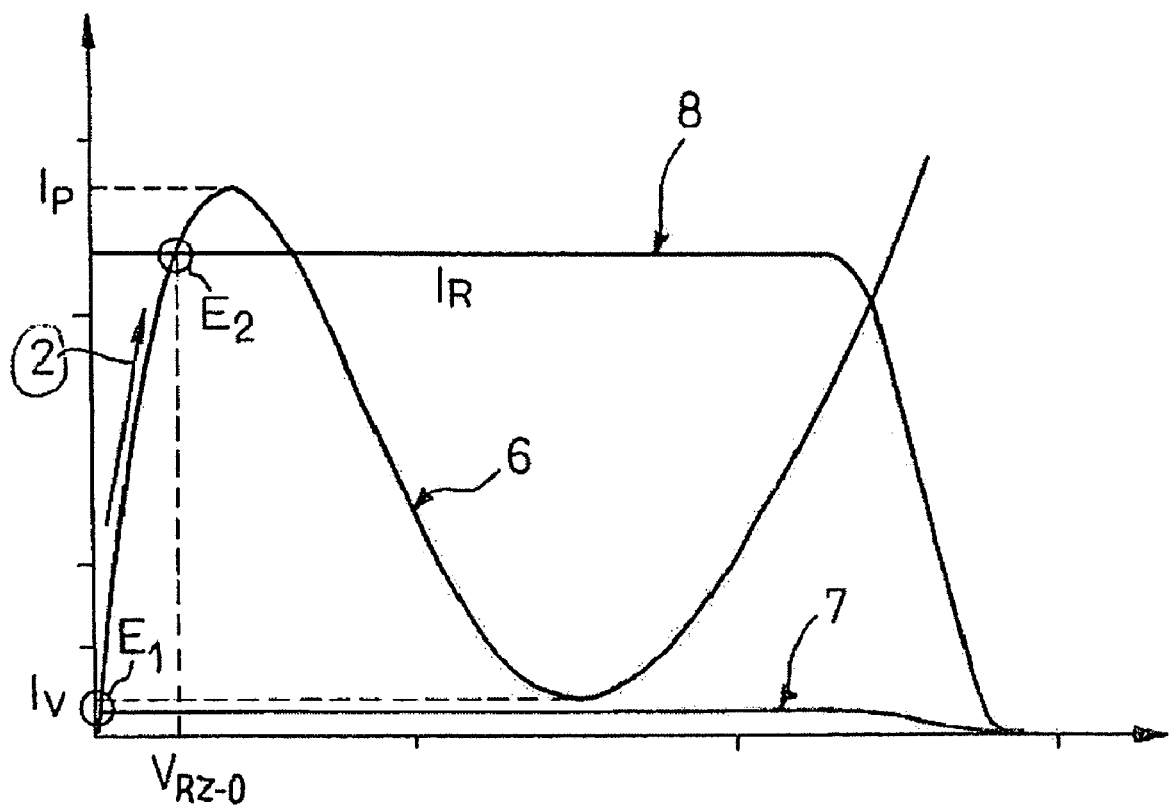

FIG_4
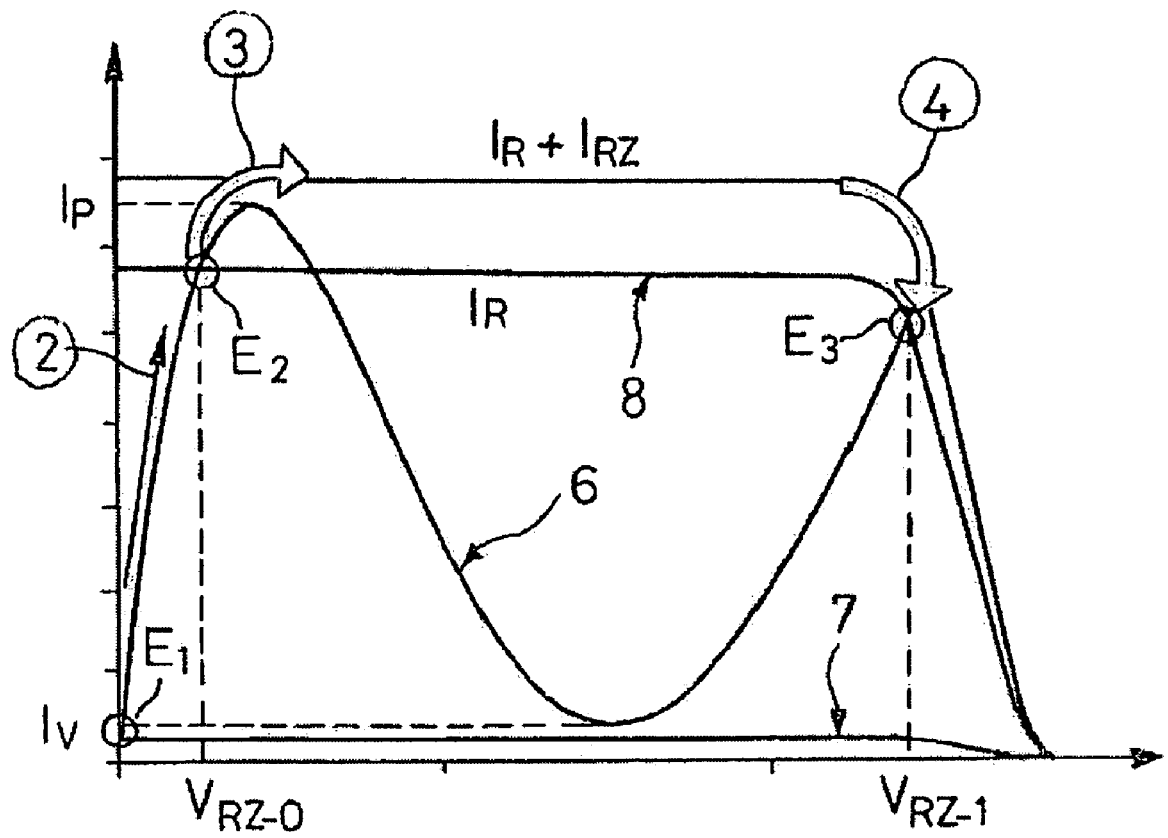

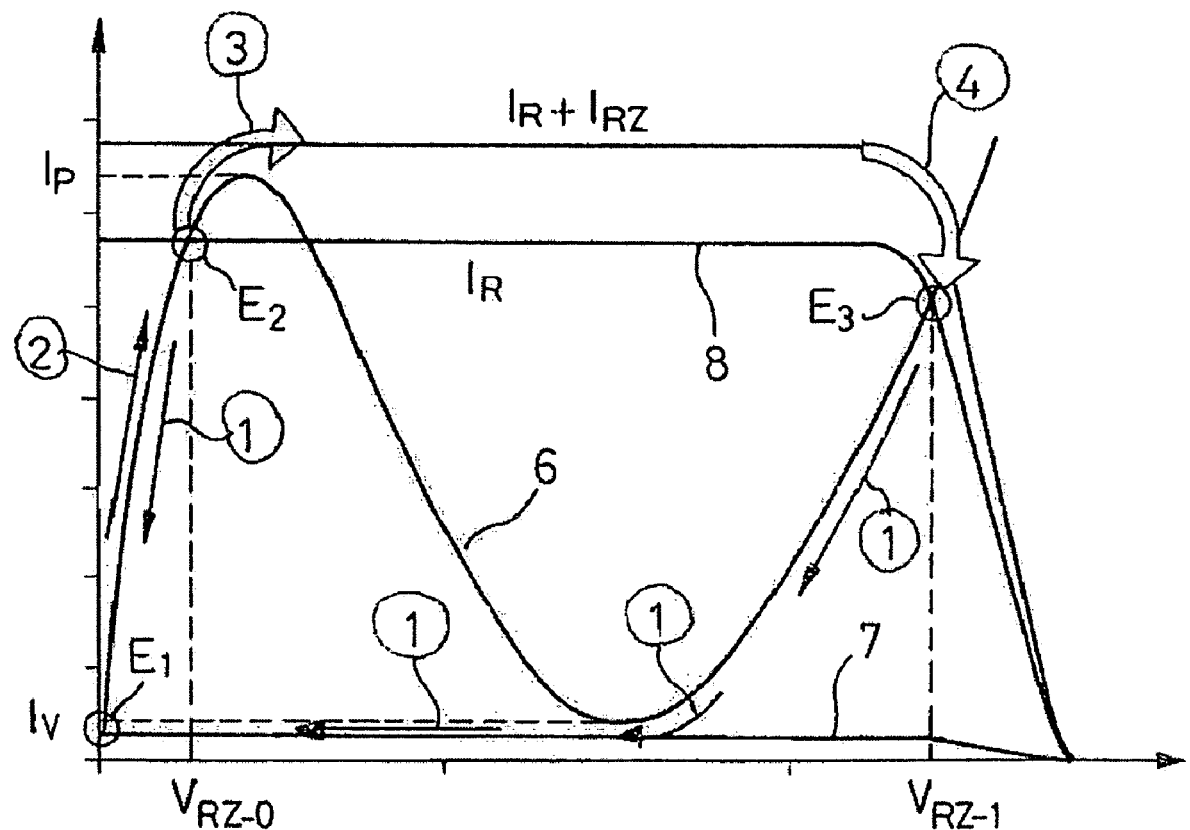
FIG_5

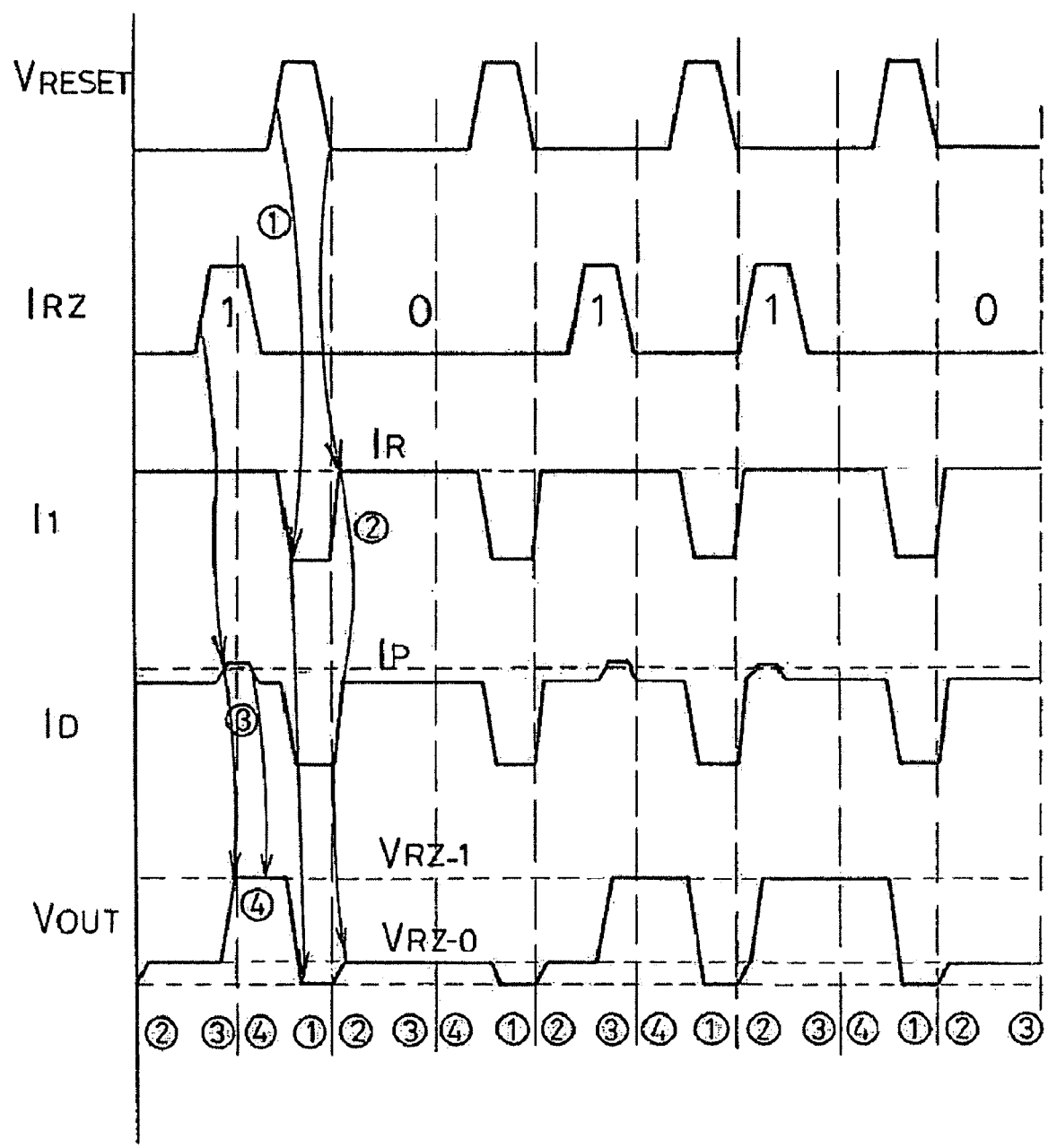
FIG_6

FIG_7
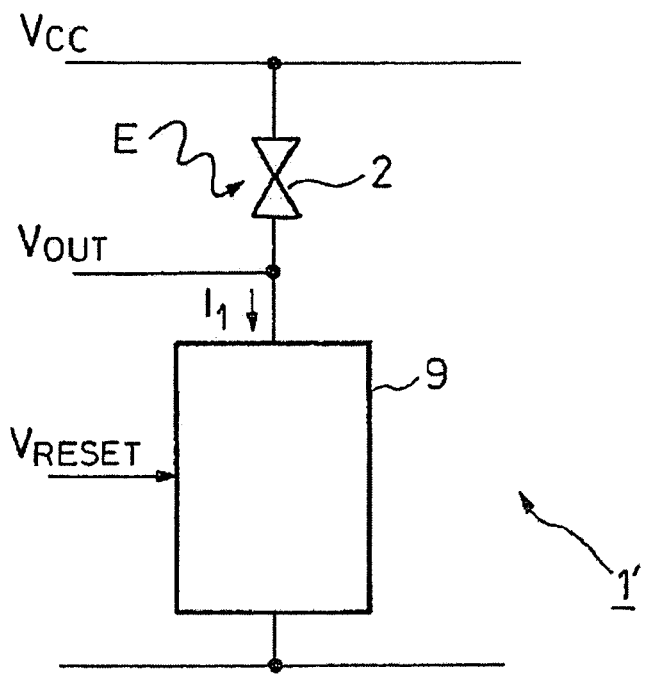
FIG_8
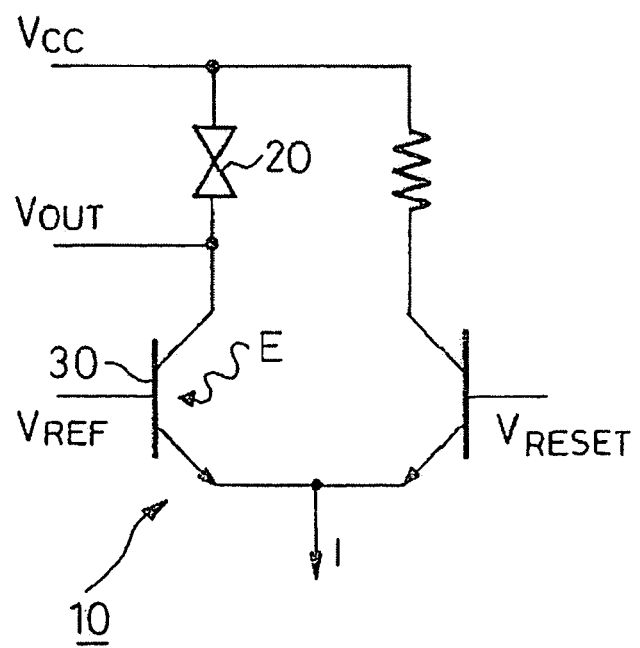

DEVICE FOR PROCESSING AN OPTICAL SIGNAL

BACKGROUND OF THE INVENTION

The present invention relates to a device for processing an optical signal. The device is particularly adapted to making a decision circuit in the field of very high data rate optical signal transmission.

It is becoming and more important to have very high data rate transmission networks in order to satisfy the growing needs for services associated with data transmission. Optical fiber with its large passband is the preferred medium for long distance transmission.

Typically, an optical signal is in the form of a carrier wave which is modulated between two states: a high state or logic "1", and a low state or logic "0"; modulation being performed at a clock frequency which defines the data rate. The time allowed for containing one bit, i.e. the bit time, is thus the clock period.

At present, transmission systems can be made having data rates of 40 gigabits per second (Gbit/s) using time division multiplexing (TDM). Optical transmission at several terabits per second (Tbit/s) is then possible by combining wavelength division multiplexing (WDM) with 40 Gbit/s transmission per wavelength.

In order to achieve such performance, very fast circuits are needed; thus it is very important in particular to design decision circuits that operate at rates of 40 Gbit/s and even higher, e.g. up to 80 Gbit/s. An optoelectronic decision circuit serves in particular to convert, with a certain time delay, successive levels of a received modulated optical signal in which it is difficult to say whether the levels corresponding to logic "1" or logic "0", into a digital electrical signal which is easier to interpret.

The document "An 80-Gb/s optoelectronic delayed flip-flop IC using resonant tunneling diodes and uni-traveling carrier photodiode" (Kimikazu et al., IEEE Journal of Solid State Circuits, Vol. 36, No. 2, February 2001) thus describes a decision circuit capable of operating at a rate of 80 Gbit/s. That decision circuit has two resonant tunnel effect diodes (RTDs) in series and a unipolar photodiode in parallel with one of the two resonant tunnel effect diodes. It is the voltage across the terminals of the photodiode combined with the clock front that enables state to be changed in a stable manner. That circuit enables an input modulated optical signal to be copied with a certain delay, the conversion process taking place on the rising fronts of a clock signal.

Nevertheless, such a circuit poses certain difficulties.

Thus, the phase margin, in other words its ability to accept time shifts between the clock signal and the clock rate of the data signal is a crucial criterion. In the decision circuit described in the document "An 80-Gb/s optoelectronic delayed flip-flop IC using resonant tunneling diodes and uni-traveling carrier photodiode", the phase margin is necessarily small when operating at high frequency, and thus in particular at data rates of 80 Gbit/s, and it is particularly difficult to obtain clock fronts which occur with a small margin of error at instants when a data signal modulated with a return-to-zero (RZ) type format is readable.

SUMMARY OF THE INVENTION

The present invention seeks to provide a device for processing an input signal having an RZ type format, and that enables an improved phase margin to be obtained at high frequency.

For this purpose, the present invention provides a processing device for processing an input optical data signal modulated with a return-to-zero type modulation format, the device comprising an electronic component having a tunnel diode characteristic presenting a peak current and a valley current, said device being characterized in that it further comprises:

a controlled current source suitable for injecting into said electronic component an electric current that is a function of a control signal; said current being capable of taking a first current value or a second current value;

current generator means suitable for injecting into said electronic component an additional electric current generated in response to said input data signal;

said valley current having a value that is greater than said first current value and said peak current having a value that lies between said second current value and the sum of said second current value plus the value of said current generated by said generator means.

Typically, the control signal has a reinitialization function and corresponds to a train of squarewave pulses. The electronic component having a tunnel diode characteristic possesses a bistable configuration with two stable states A and B. The appearance of a control pulse forces the component into its stable state A. However, between two control pulses, if the RZ input signal presents a high level, the component passes from an initial stable state A to the other stable state B; otherwise, if the input signal presents a low level, the component remains in its initial state. By means of the invention, it suffices for the input signal to take a high level corresponding to a logic "1" between two control pulses to cause the component to go from state A to state B. By using control pulse durations that are sufficiently short relative to bit time, it is thus possible to obtain a considerable improvement in phase margin.

Advantageously, said electronic component is a resonant tunnel effect diode.

In a first embodiment, said electronic component is a photosensitive resonant tunnel effect diode and constitutes said current generator means.

Advantageously, said current source comprises two transistors mounted as a differential pair fed by a constant current, one of said transistors being connected in series with said electronic component.

In a second embodiment, said current source comprises two transistors mounted as a differential pair fed by a constant current, one of said transistors being a photosensitive transistor connected in series with said electronic component, said photosensitive transistor constituting said current generator means.

Advantageously, said modulation format of the input data signal presents a given bit time, and said control signal is made up of voltage pulses of duration shorter than half the bit time.

The present invention also provides a decision circuit for an input data signal having a modulation format of the return-to-zero type presenting a clock rate of given frequency characterized in that it comprises a processing device of the invention, and in that said control signal is constituted by a pulse train at said given frequency.

Other characteristics and advantages of the present invention appear from the following description of an embodiment of the invention given by way of purely illustrative and non-limiting example.

BRIEF DESCRIPTION OF THE DRAWING

In the accompanying figures:

FIG. 1 shows a first embodiment of a processing device of the invention;

FIGS. 2 to 5 show current-voltage characteristics of the device shown in FIG. 1;

FIG. 6 shows timing diagrams for various signals in operation of the device shown in FIG. 1;

FIG. 7 shows a second embodiment of a processing device of the invention; and

FIG. 8 shows a third embodiment of a processing device of the invention.

DETAILED DESCRIPTION OF THE INVENTION

In all of the figures, common elements are given the same reference numerals.

FIG. 1 shows a processing device 1 of the invention.

The processing device 1 comprises:
a photosensitive resonant tunnel effect diode 2;
a first bipolar transistor 3;
a second bipolar transistor 4; and
a resistor 5.
a single photosensitive resonant tunnel effect diode 2;

The bipolar transistors 3 and 4 are heterojunction bipolar transistors (HBTs), for example.

The photosensitive resonant tunnel effect diode 2 has its first terminal connected to a potential $V_{CC}$, conventionally zero potential, and has its second terminal connected to the collector of the bipolar transistor 3.

The resistor 5 has its first terminal connected to the potential $V_{CC}$ and its second terminal connected to the collector of the bipolar transistor 4.

The bipolar transistors 3 and 4 are connected as a differential pair, and their emitters are both connected to a common current source I.

The base of transistor 3 is fixed to a substantially constant potential $V_{REF}$.

The single photosensitive resonant tunnel effect diode 2 has its first terminal connected to a potential $V_{CC}$, conventionally zero potential, and has its second terminal connected to the collector of the bipolar transistor 3.

The device 1 may be implemented in the form of an integrated circuit. Thus, the document "InP-based monolithically integrated RTD/HBT mobile for logic circuits" (Otten et al., Conference Proceedings, 13th IPRM, May 14–18, 2001, pp. 232–235) describes how to integrate a resonant tunnel effect diode (RTD) with a heterojunction bipolar transistor (HBT).

The diode 2 receives an optical data signal E such as an optical signal clocked at a bit frequency that is equal to about 80 Gbit/s, for example.

The output voltage $V_{OUT}$ supplied by the device 1 is taken from the collector of transistor 3.

In general manner, the current flowing through transistor 3 and the diode 2 is written $I_1$ and the current flowing through the transistor 4 and the resistor 5 is written $I_2$.

A $V_{RESET}$ pulse on the base of the transistor 4 causes all of the current I to flow through the right-hand branch comprising the resistor 5 and the transistor 4. The current $I_1$ is therefore very low while the current $I_2$ is substantially equal to I. The current flowing through the diode 2 is practically zero; the voltage across the terminals of the diode 2 is practically zero and the output voltage $V_{OUT}$ is equal to $V_{CC}$ and is thus substantially zero.

This first state $E_1$ is shown in FIG. 2 which represents the current-voltage $I_1$-V characteristics 6 and 7 respectively of the diode 2 and of the transistor 3.

The current-voltage characteristic 6 of the diode 2 is a conventional characteristic for a tunnel diode, showing the current flowing through the diode as a function of the voltage across its terminals; this characteristic presents a peak current $I_P$ and a valley current $I_V$.

The characteristic 7 shows the current characteristic of the collector of transistor 3 as a function of the voltage between the collector and the emitter of transistor 3. This characteristic is shown "upside-down" with the origin at the bias value; thus, where the characteristics 6 and 7 cross, the currents are equal at a voltage constituting a bias voltage.

It can be seen that this state $E_1$ corresponding to the intersection of curves 6 and 7 presents current that is very low, being lower than the valley current. The current $I_1$ is thus very low and the output voltage $V_{OUT}$ is practically zero.

At the end of the $V_{RESET}$ pulse, the current I feeds the left-hand branch, and thus the current $I_1$ is no longer zero and takes a value $I_R$ close to I, and less than the peak current $I_P$. The device 1 is thus in state $E_2$.

Switching from state $E_1$ to this second state $E_2$ is represented by arrow ② in FIG. 3.

The characteristic 8 represents the characteristic of the collector current of the transistor 3 as a function of the voltage between the collector and the emitter of the transistor in the absence of a $V_{RESET}$ pulse.

The state $E_2$ is then defined by the intersection between the characteristic 8 of the transistor 3 and the characteristic 6 of the diode 2.

The voltage across the terminals of the diode 2 substantially equal to the voltage $V_{OUT}$ is equal to $V_{RZ-0}$ situated ahead of the peak voltage of the characteristic 6 corresponding to the peak current $I_P$.

The transistor 3 and the diode 2 carry the current $I_R$ which is less than the peak current $I_P$.

This state $E_2$ is a stable operating state.

When an optical signal E corresponding to a pulse (i.e. to a logic "1") of light reaches the diode 2 prior to the following $V_{RESET}$ pulse, the light pulse is converted by the photosensitive diode 2 into a current pulse $I_{RZ}$ which is added to the current $I_R$ passing through the diode 2. Thus, if the current passing through the diode is written $I_D$, then in order to take account of this photocurrent, the current $I_D$ at this instant is equal to $I_R+I_{RZ}$.

The changeover from the current $I_R$ to a total current $I_{RZ}+I_R$ is represented by arrow ③ in FIG. 4. This total current is greater than the peak current $I_P$.

Thus, in order to be in a new stable state, the arrow ④ designates passing to a new stable state $E_3$ which is the only possible stable state. The voltage across the terminals of the diode 2 which is substantially equal to $V_{OUT}$ is then equal to $V_{RZ-1}$ greater than the voltage $V_{RZ-0}$.

Since this state $E_3$ is a stable operating state, the device 1 remains in this state even after the light pulse E has disappeared.

When the device 1 is in one of its two stable states $E_2$ or $E_3$, a $V_{RESET}$ pulse serves to cause the device to pass back to the state $E_1$. This is represented in FIG. 5 by various arrows ①.

FIG. 6 shows the signals $V_{RESET}$, $I_{RZ}$, $I_1$, $I_D$, and $V_{OUT}$ as a function of time.

It can clearly be seen in these diagrams that the voltage $V_{OUT}$ can take three values $V_{CC}$, $V_{RZ-0}$, and $V_{RZ-1}$ corresponding respectively to the states $E_1$, $E_2$, and $E_3$.

This voltage $V_{OUT}$ is the improved and time-shifted image of the light pulse E corresponding to the current $I_{RZ}$. If the pulses of the $V_{RESET}$ signal are sufficiently short, a current pulse $I_{RZ}$ corresponding to a logic "1" can give rise to a voltage pulse $V_{OUT}$ of duration that is longer than the duration of the pulse $I_{RZ}$. The closer the pulse $I_{RZ}$ situated between two pulses $V_{RESET}$ is brought to the first pulse $V_{RESET}$, the greater the duration of the pulse $V_{OUT}$; this can be seen for the third pulse $V_{OUT}$ shown in FIG. 6.

It should also be observed that the time between two successive vertical lines represents half a bit time. It is thus clear that the shorter the duration of the $V_{RESET}$ pulse compared with half a bit time, the greater the phase margin. The shorter the duration of the $V_{RESET}$ pulse, the greater the chance a current pulse $I_{RZ}$ has of occurring between two pulses $V_{RESET}$.

The voltage control current source comprising the differential pair of transistors 3 and 4 as shown in FIG. 1 is given by way of example and it can be replaced by any other type of voltage control current source.

Thus, FIG. 7 represents the principle on which a device 1' of the invention is based. It is identical to the device as shown in FIG. 1, except that it has an arbitrary current source 9 controlled by the voltage $V_{RESET}$.

FIG. 8 shows a third embodiment of a device 10 of the invention.

The device 10 is identical to the device shown in FIG. 1 except that the single diode 20 is a non-photosensitive resonant tunnel effect diode and the bipolar transistor 30 is a photosensitive transistor. Apart from these differences, the device 10 operates in similar manner to that described with reference to FIGS. 1 to 6.

Naturally, the invention is not limited to the embodiment described above.

In particular, it is possible to envisage using a bipolar transistor controlled directly by its base current without using a differential pair.

In addition, the description of the device is given using a resonant tunnel effect diode, but it is perfectly possible to envisage using a conventional tunnel effect diode.

It is also possible to replace the bipolar transistors as described by field effect transistors (FETs) controlled by their grid voltages.

What is claimed is:

1. A processing device (1) for processing an input optical data signal (E) modulated with a return-to-zero (RZ) type modulation format, the device comprising an electronic component (2) having a tunnel diode characteristic presenting a peak current ($I_P$) and a valley current ($I_V$), said device (1) being characterized in that it further comprises:
    a controlled current source (3, 4, 9) suitable for injecting into said electronic component (2) an electric current that is a function of a control signal ($V_{RESET}$), said current being capable of taking a first current value or a second current value ($I_R$); and
    current generator means (2, 30) suitable for injecting into said electronic component (2) an additional electric current ($I_{RZ}$) generated in response to said input data signal (E),
    said valley current ($I_V$) having a value that is greater than said first current value and said peak current ($I_P$) having a value that lies between said second current value ($I_R$) and the sum of said second current value ($I_R$) plus the value of said additional current ($I_{RZ}$) generated by said generator means (2).

2. The device (1) according to claim 1, characterized in that said electronic component (2, 20) is a resonant tunnel effect diode.

3. A processing device (1) for processing an input optical data signal (E) modulated with a return-to-zero (RZ) type modulation format, the device comprising an electronic component (2) having a tunnel diode characteristic presenting a peak current ($I_P$) and a valley current ($I_V$), said device (1) being characterized in that it further comprises: a controlled current source (3, 4, 9) suitable for injecting into said electronic component (2) an electric current that is a function of a control signal ($V_{RESET}$), said current being capable of taking a first current value or a second current value ($I_R$);
and
    current generator means (2, 30) suitable for injecting into said electronic component (2) an additional electric current ($I_{RZ}$) generated in response to said input data signal (E);
    said valley current ($I_V$) having a value that is greater than said first current value and said peak current ($I_P$) having a value that lies between said second current value ($I_R$) and the sum of said second current value ($I_R$) plus the value of said additional current ($I_{RZ}$) generated by said generator means (2),
    wherein said electronic component (2) is a photosensitive resonant tunnel effect diode and constitutes said current generator means.

4. The processing device (1) according to claim 1, characterized in that said current source comprises two transistors (3, 4) mounted as a differential pair fed by a constant current (I), one of said transistors (3) being connected in series with said electronic component (2).

5. A processing device (10) for processing an input optical data signal (E) modulated with a return-to-zero (RZ) type modulation format, the device comprising an electronic component (2) having a tunnel diode characteristic presenting a peak current ($I_P$) and a valley current ($I_V$), said device (1) being characterized in that it further comprises:
    a controlled current source (3, 4, 9) suitable for injecting into said electronic component (2) an electric current that is a function of a control signal ($V_{RESET}$), said current being capable of taking a first current value or a second current value ($I_R$); and
    current generator means (2, 30) suitable for injecting into said electronic component (2) an additional electric current ($I_{RZ}$) generated in response to said input data signal (E);
    said valley current ($I_V$) having a value that is greater than said first current value and said peak current ($I_P$) having a value that lies between said second current value ($I_R$) and the sum of said second current value ($I_R$) plus the value of said additional current ($I_{RZ}$) generated by said generator means (2),
    wherein said current source comprises two transistors (3, 4) mounted as a differential pair fed by a constant current (I), one of said transistors (30) being a photosensitive transistor connected in series with said electronic component (2), said photosensitive transistor (30) constituting said current generator means.

6. A processing device (1) for processing an input optical data signal (E) modulated with a return-to-zero (RZ) type modulation format, the device comprising an electronic component (2) having a tunnel diode characteristic presenting a peak current ($I_P$) and a valley current ($I_V$), said device (1) being characterized in that it further comprises:
    a controlled current source (3, 4, 9) suitable for injecting into said electronic component (2) an electric current that is a function of a control signal ($V_{RESET}$), said current being capable of taking a first current value or a second current value ($I_R$); and current generator means (2, 30) suitable for injecting into said electronic component (2) an additional electric current ($I_{RZ}$) generated in response to said input data signal (E);

said valley current ($I_V$) having a value that is greater than said first current value and said peak current ($I_P$) having a value that lies between said second current value ($I_R$) and the sum of said second current value ($I_R$) plus the value of said additional current ($I_{RZ}$) generated by said generator means (2), wherein said modulation format of the input data signal (E) presents a given bit time, and said control signal ($V_{REF}$) is made up of voltage pulses of duration shorter than half the bit time.

7. A decision circuit for an input data signal (E) having a modulation format of the return-to-zero (RZ) type presenting a clock rate of given frequency, the circuit being characterized in that it comprises a processing device comprising an electronic component (2) for processing an input optical data signal (E) modulated with a return-to-zero (RZ) type modulation format, the device comprising an electronic component (2) having a tunnel diode characteristic presenting a peak current ($I_P$) and a valley current ($I_V$), said device (1) being characterized in that it further comprises:

a controlled current source (3, 4, 9) suitable for injecting into said electronic component (2) an electric current that is a function of a control signal ($V_{RESET}$), said current being capable of taking a first current value or a second current value ($I_R$); and current generator means (2, 30) suitable for injecting into said electronic component (2) an additional electric current ($I_{RZ}$) generated in response to said input data signal (E);

said valley current ($I_V$) having a value that is greater than said first current value and said peak current ($I_P$) having a value that lies between said second current value ($I_R$) and the sum of said second current value ($I_R$) plus the value of said additional current ($I_{RZ}$) generated by said generator means (2), and in that said control signal ($V_{RESET}$) is constituted by a pulse train at said given frequency.

8. An integrated circuit including a device according to claim 1.

9. An integrated circuit including a device according to claim 4.

10. An integrated circuit including a device according to claim 5.

11. An integrated circuit including a device according to claim 6.

12. The device according to claim 1, comprising only a single said electronic component.

13. The device according to claim 12, wherein said single electronic component is a single resonant tunnel effect diode.

* * * * *